(12) United States Patent
Mühsam

(10) Patent No.: US 10,193,278 B2
(45) Date of Patent: Jan. 29, 2019

(54) EXCHANGEABLE MODULE FOR A COMPUTER SYSTEM AS WELL AS COMPUTER SYSTEM

(71) Applicant: FUJITSU LIMITED, Kawasaki-shi, Kanagawa (JP)

(72) Inventor: Gerhard Mühsam, Königsbrunn (DE)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/694,897

(22) Filed: Sep. 4, 2017

(65) Prior Publication Data
US 2018/0138634 A1    May 17, 2018

(30) Foreign Application Priority Data

Nov. 17, 2016 (DE) .......................... 10 2016 122 151

(51) Int. Cl.
| | |
|---|---|
| H01R 13/60 | (2006.01) |
| H01R 13/639 | (2006.01) |
| G06F 1/16 | (2006.01) |
| H01R 13/58 | (2006.01) |
| H05K 7/14 | (2006.01) |

(52) U.S. Cl.
CPC ............ *H01R 13/639* (2013.01); *G06F 1/16* (2013.01); *H01R 13/58* (2013.01); *H05K 7/1485* (2013.01)

(58) Field of Classification Search
CPC .................................................. H01R 13/443
USPC ................................ 439/528, 911, 152, 474
See application file for complete search history.

(56) References Cited

U.S. PATENT DOCUMENTS

| | | | | |
|---|---|---|---|---|
| 3,270,267 | A * | 8/1966 | Nolte, Jr. ............. | H01R 13/633 200/51.09 |
| 5,486,117 | A * | 1/1996 | Chang ................ | H01R 13/6275 439/353 |
| 5,852,544 | A * | 12/1998 | Lee ........................ | G06F 1/181 361/679.6 |
| 5,941,729 | A * | 8/1999 | Sri-Jayantha ...... | H01R 13/6205 439/289 |

(Continued)

FOREIGN PATENT DOCUMENTS

| | | |
|---|---|---|
| DE | 10029096 A1 | 12/2001 |
| DE | 20204345 | 8/2002 |

(Continued)

OTHER PUBLICATIONS

GBSR—Search Report under Section 17(5) dated Jan. 31, 2018 for Application No. GB1713656.5.

*Primary Examiner* — Phuong Dinh
(74) *Attorney, Agent, or Firm* — Fujitsu Patent Center

(57) ABSTRACT

The invention relates to an exchangeable module for a computer system, comprising
a module body, which can be secured at a predetermined installation position inside the computer system,
a cable connection leading to the outside from the module body, at the end of which connection is arranged a plug connector, so that the module can be electrically coupled with another component of the computer system, and
a safety device, by means of which the plug connector is mechanically connected to the module body, wherein the safety device is configured such that when a pulling force is applied to the module body, the cable connection is not subject to the pulling force.
Furthermore, the invention relates to a computer system.

8 Claims, 1 Drawing Sheet

(56) References Cited

U.S. PATENT DOCUMENTS

| | | | | |
|---|---|---|---|---|
| 6,461,192 B1* | 10/2002 | Kwoka | ............... | H01R 31/06 |
| | | | | 439/505 |
| 7,585,179 B2* | 9/2009 | Roberts | ............... | G01V 1/201 |
| | | | | 439/451 |
| 9,093,788 B2* | 7/2015 | Lamb | ............... | H01R 13/633 |
| 2002/0064983 A1* | 5/2002 | Patey | ............... | H01R 13/7038 |
| | | | | 439/152 |
| 2005/0170686 A1 | 8/2005 | Thorland et al. | | |

FOREIGN PATENT DOCUMENTS

| | | |
|---|---|---|
| DE | 20205004 | 10/2002 |
| DE | 102005001127 | 8/2005 |
| GB | 2415838 | 1/2006 |

\* cited by examiner

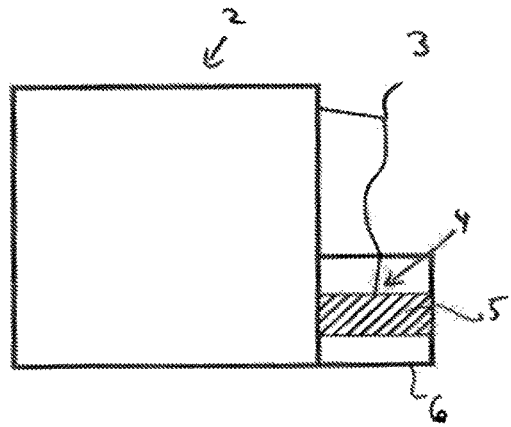
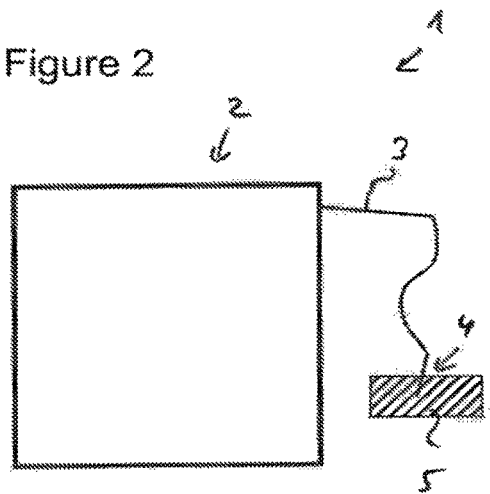
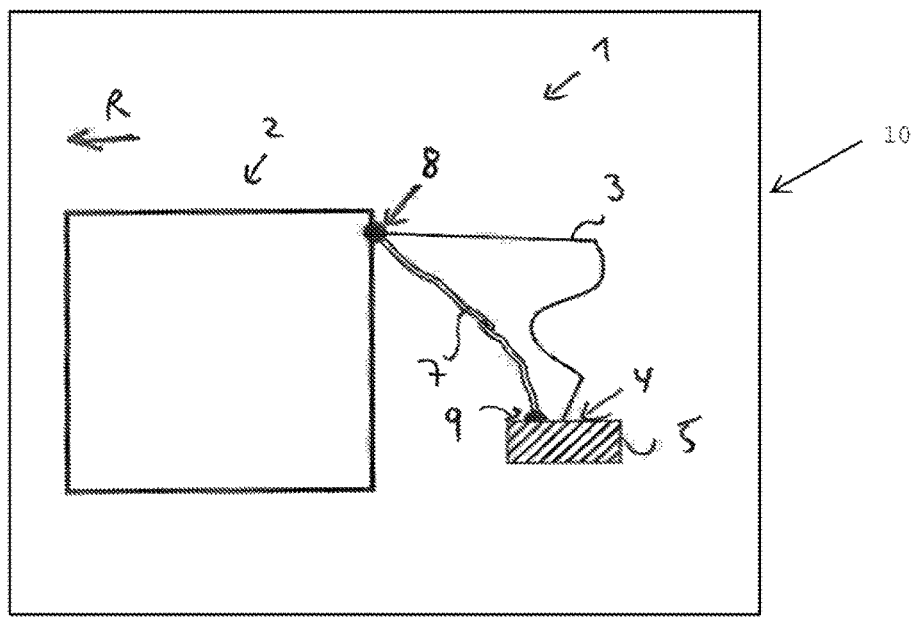

EXCHANGEABLE MODULE FOR A COMPUTER SYSTEM AS WELL AS COMPUTER SYSTEM

BACKGROUND

Computer systems, in particular in the field of servers, typically include a plurality of electric modules, which often must be replaced during the "life span" of the computer system. Such modules are fans, storage mediums, power supply units or the like, for example. It is known to provide multiple of such modules in a redundant manner to ensure functionality by the one or the further modules even if one module fails.

In particular in the field of servers, it is particularly important for the replacement of such modules to consume little time and cost. The modules typically include a cable connection with a plug. When replacing a module, this plug must be unplugged from a corresponding mating plug first to allow safe removal of the module. However, there is a risk that—e.g. due to carelessness—the module is pulled first and the cable connection is damaged as a result since it is still plugged in the mating plug.

SUMMARY

One object underlying the invention is to provide an improved concept for exchangeable modules of computer systems, which contributes to a non-destructive and safe replacement of such modules.

The present invention describes an exchangeable module for a computer system. The module comprises a module body, which can be secured at a predetermined installation position inside the computer system. Furthermore, the module has a cable connection leading from the module body to the outside and having a plug connector arranged at the end thereof, so that the module can be coupled with a further component of computer system. The module has a safety device, by means of which the plug connector is mechanically coupled to the module body. The safety device is configured in such a way that when applying a pulling force on the module body, the cable connection remains free of the pulling force.

The safety device, which can also be referred as safety connection, ensures that a pulling force applied to the module is neither applied to the plug connector via the cable connection nor transmitted to the plug connector via the cable connection, respectively. The applied pulling force can merely act on the plug connector via the safety device. As described above, if now one would try to first remove the module or the module body from the installation position before uncoupling the plug connector, the applied force will not act on the cable connection. This contributes to a protection against damage or destruction of the module while handling it per se. A breakaway of the cable connection from the module body or from the plug connector, a tearing of the cable connection per se or other damages are prevented. Advantageously, the safety device can be designed in such a way that, in the electrically-coupled state, unplugging the module unplugs the plug connector from the mating plug at the same time. Additionally, or alternatively, the safety device prevents, at least to some extent, e.g. a certain pulling force, that the module can be directly removed with the plug connector still being plugged-in. This would remind a user to first uncouple the plug connector to properly remove the module afterwards.

The safety device is a strain relief or is configured as such. The safety device is directly or indirectly mechanically secured to the module body. In other words, the safety device is either per se directly fixed to the module body or via another component, e.g. a fan grille or the like, with the other component per se being fixedly arranged on the module body.

The computer system is a desktop computer or a server, for example.

The module is an electronic installation component for the computer system. The module can be placed or inserted into a mounting cage or a mounting device in the computer system. The module can securely be held in the respective installation position by means of latching or clamping. However, additional measures may also be necessary to secure the module in the installation position. The module is a fan, a power supply unit or a storage medium such as a hard disk, for example. In other words, the module is e.g. one of those components of the computer system that typically must be replaced, in particular due to wear or failure. The module is a component inside the computer system and therefore an element inside the housing. For example, it is no peripheral device externally connected to the system.

The module body includes at least one or multiple electronic components, e.g. in a module body housing or a body frame of the module. The cable connection is connected to one or multiple electronic components for an electrical and/or signal-related connection. The module can be coupled with the other component, e.g. a mainboard or the like, via the plug connector. The plug connector is not fixedly, but removably, e.g. flexibly connected to the module body via the cable connection.

According to one embodiment, the safety device is designed to be flexible. This comes with the advantage that no mechanical vibration is transmitted from the module to other components of the computer systems, e.g. a computer casing (chassis). This would in particular be the case with modules providing a direct plug to the further component, e.g. the mainboard. In such modules, the plug connector is connected to the module body in a rigid manner. When inserting or attaching the module at the installation position, this would also effect electric coupling of the plug connector to the further component in the final position. Even if the module body is per se supported in a vibration-damping manner, mechanical oscillation or vibration of the module body propagates at least via the rigid or inflexible connection of the plug connector. This rigid coupling is to be avoided in various cases, e.g. with fans. The rigid connection of the pug connector can be realized by means of a rigid bracket that is a of the module body, for example. The plug connector is latched in the bracket, for example. Together with the module body, the plug connector forms an individual assembly unit.

According to one embodiment, a maximum length of the safety device between the module body and the plug connector is less than a maximum length of the cable connection between the module body and the plug connector. This ensures that an acting pulling force is only transmitted via the safety device when plugging or unplugging the module, since this safety device is completely stretched first before the cable connection can be stretched. As used herein, the term "length" relates to a maximum clearance between the module body and the plug connector. It is negligible here whether the cable connection and/or the safety device protrude further into the module body or further into the plug connector, respectively.

According to one embodiment, the safety device is mechanically fixed to a housing or a frame of the module body and mechanically fixed to the plug connector. The safety device is secured to the housing or the frame of the module body with a first end, e.g. by means of a substance-to-substance bond like welding or gluing, or by means of other connecting techniques such as riveting, screwing and the like. Alternatively, or in addition, the second end of the safety device opposite the first end is mechanically coupled to the plug connector in the same way.

According to one embodiment, the safety connection for connecting to the module body and/or for connecting to the plug connector comprises one or multiple latch elements. The safety device is a separate element and can therefore easily be mounted by means of a latch connection.

According to one embodiment, the module is designed as a hot-plug module. An important criterium for exchangeable modules is the so-called hot-plug function so that these modules can be used in highly-available systems, for example. In other words, the modules can be replaced in operation of the computer system. Therefore, the fan modules must be configured in such a way that no complex connecting or fixing operations that require the system to be turned off are required. Especially during operation, a fast and safe replacement must be ensured, wherein modules have to be replaced in many cases pressed for time. The safety device is particularly suitable for these cases, wherein damages, e.g. short circuits, are prevented.

According to one embodiment, the module is configured as a power supply unit or a fan. Such components must be replaced frequently, e.g. in server systems.

According to one embodiment, the safety device is formed as a cord, rope or a chain. The safety device is formed as a wire cable, a fishing line, a nylon cord or of another type.

According to one embodiment, the safety device is formed integrally with the module body or with a component of the module body. The module is e.g. a fan with a fixedly-mounted fan grille. The safety device may form part of the fan grille, i.e. be formed integrally with said grille. Therefore, the ventilation grille can be produced by means of an injection molding method, wherein the safety device extends from the ventilation grille, the safety device per se designed to be flexible.

Furthermore, a computer system, in particular a server system is described. The computer system comprises a computer housing, in which an installation position is formed and in which an electric component is arranged. The computer system comprises an exchangeable module according to one of the above-described embodiments. The module body of the module is secured to the installation position and electrically coupled to the electric component by means of the plug connector. As described above, the installation position can be a mounting position in a mounting cage.

The computer system allows the above functions and advantages.

Further advantageous embodiments are disclosed in the sub-claims and in the following detailed description of an exemplary embodiment.

The exemplary embodiment is described below using the accompanying figures. Like or similar elements are indicated with the same reference characters throughout the figures.

FIGURES

The figures show in:

FIG. 1 an exchangeable module according to one embodiment,

FIG. 2 an exchangeable module according to another embodiment, and

FIG. 3 an exchangeable module according to an exemplary embodiment of the invention.

DETAILED DESCRIPTION

FIGS. 1 and 2 each schematically show an exchangeable module 1. In the illustrated embodiments, modules 1 are in each case a fan with hot-plug function, which is inserted in the computer system as a part of a fan board, for example.

A module 1 in each case has a module body 2, by means of which the module 1 can be secured in an installation position in a computer system 10 of FIG. 3 (components inside the rectangle are inside the computer system 10). For example, a module body 2 has a housing or a frame and the outer shape of the body is adapted to the installation position. As a result, the module body 2 can e.g. be received in the installation position in a form-fit manner, e.g. in a mounting cage. The module body 2 has one or multiple electronic or mechanical components, e.g. an electrically-driven fan impeller, a microcontroller and others (not shown) located therein.

In addition, each module has a cable connection 3 that leads out of the module body 2 and is electrically connected to one or multiple electric components inside the module body 2, e.g. inside the housing. Furthermore, the cable connection 3 is secured to the module body 2 within the module body 2 or on the module body 2. On a free end 4 of the cable connection 3, the latter is fixedly coupled with a plug connector 5 of the module 1. The module 1 is electrically coupled for power supply and/or data transmission with a mating plug of a further component, e.g. a mainboard of the computer system (not shown) via the plug connector 5.

While according to the embodiment in FIG. 2, the plug connector 5 is loosely held on the module 1 via the cable connection, the plug connector according to the embodiment of FIG. 1 is fixed on the module body in a rigid manner. For example, a bracket 6 which forms a part of the module body 2 is provided to that end.

On the one hand, the two embodiments come with the disadvantage (FIG. 1) that mechanical vibration is transmitted to other components, irrespective of a damping of the module body 2, e.g. by means of rubber feet, through the rigid connection of the plug connector 5 via said connector. As described above, this is not desired. On the other hand (FIG. 2), it is disadvantageous that physical removal of the module 1 from the installation position can lead to damages are caused to the module 1 or the cable connection 3 if the plug connector is still plugged-in.

FIG. 3 shows an exemplary embodiment of the invention, which is based on the example of FIG. 2. The plug connector 5 is held on the module body 2 via the cable connection 3 in a freely movable manner, e.g. flexible.

In addition, the module 1 has a safety device 7, which is formed as a wire cable in the exemplary embodiment. The wire cable is flexible such that a general flexibility for coupling the plug connector 5 with the mating plug connector is maintained.

The safety device 7 is, inter alia, configured as a strain relief, having a first end 8 mechanically secured to the module body 3, e.g. to the housing or the frame, and having a second end 9 mechanically coupled to the plug connector 5, respectively. The fastening may take place in different ways, e.g. adhesively, or by a non-positive or positive connection. Also, the safety device 7 may latch on the module body 2 and/or the plug connector 5 by means of latch elements. This allows implementing a simple and fast snap connection. The actual mechanical connection does not necessarily have to be located on an outer side of the module body 2 or the plug connector 5 and can also be located within the respective components.

A maximum length of the safety device 7 in a rectilinear-running state is shorter compared to a maximum length of the cable connection 3. The lengths are to be considered as a clearance between the module body 2 and the plug connector 5, i.e. starting from the point at which the cable connection 3 or the safety device 7 protrude from the outer side of the module body 3 to a point at which the two components would meet with the plug connector 5. For determining the length of the cable connection 3, the safety device 7 would have to be removed virtually.

Due to the described configuration of the safety device 7, the above advantages can be achieved. Thus, a pulling force applied to the module 1 or the module body 3 would not act on the plug connector 5 via the cable connection 3, but through the safety device 7. As a result, the safety function can be realized on the one hand, e.g. the reminder to unplug the plug connector 5, but on the other hand unplugging during the operating state of the computer system can be accelerated at the same time when the plug connector 5 is readily released from its coupling with the mating plug when removing the module body 3. The functions may vary depending on the arrangement and configuration of the plug connectors, etc.

Alternatively, the safety device 7 may also be formed integrally with the module body 2, with the second end 9 being exposed and mounted or fixed to the plug connector 5 then. As a result, production and mounting can be simplified and less cost-intense.

LIST OF REFERENCE CHARACTERS

1 Module
2 Module body
3 Cable connection
4 Free end
5 Plug connector
6 Bracket
7 Safety device
8 First end
9 Second end
R Direction

The invention claimed is:

1. Exchangeable module for a computer system, comprising:
   a module body, which can be secured at a predetermined installation position inside the computer system,
   a cable connection leading to the outside from the module body, at the end of which connection is arranged a plug connector, so that the module can be electrically coupled with another component of the computer system, and
   a safety device, by means of which the plug connector is mechanically connected to the module body,
   wherein the safety device is configured such that when a pulling force is applied to the module body, the cable connection is not subject to the pulling force.

2. Exchangeable module according to claim 1,
   wherein the safety device is designed to be flexible.

3. Exchangeable module according to claim 1,
   wherein a maximum length of the safety device between the module body and the plug connector is smaller than a maximum length of the cable connection between the module body and the plug connector.

4. Exchangeable module according to claim 1,
   wherein the safety device is mechanically fixed to a housing or a frame of the module body and mechanically fixed to the plug connector.

5. Exchangeable module according to claim 1,
   wherein the module is formed as a hot-plug module.

6. Exchangeable module according to claim 1,
   wherein the module is formed as a power supply unit or as a fan.

7. Exchangeable module according to claim 1,
   wherein the safety device is formed as a cord, rope or chain.

8. Exchangeable module according to claim 1,
   wherein the safety device is formed integrally with the module body or with a component of the module body.

* * * * *